IIIIII

US010741262B2

(12) United States Patent
Lin et al.

(10) Patent No.: US 10,741,262 B2
(45) Date of Patent: Aug. 11, 2020

(54) NAND FLASH OPERATING TECHNIQUES MITIGATING PROGRAM DISTURBANCE

(71) Applicant: MACRONIX INTERNATIONAL CO., LTD., Hsinchu (TW)

(72) Inventors: Wei-Liang Lin, Taipei (TW); Chun-Chang Lu, Yunlin (TW); Wen-Jer Tsai, Hualien (TW); Guan-Wei Wu, Kaohsiung (TW); Yao-Wen Chang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/212,551

(22) Filed: Dec. 6, 2018

(65) Prior Publication Data

US 2020/0118630 A1  Apr. 16, 2020

Related U.S. Application Data

(60) Provisional application No. 62/745,152, filed on Oct. 12, 2018.

(51) Int. Cl.
| | |
|---|---|
| *G11C 16/34* | (2006.01) |
| *G11C 16/10* | (2006.01) |
| *G11C 16/04* | (2006.01) |
| *G11C 16/08* | (2006.01) |
| *G11C 16/24* | (2006.01) |

(Continued)

(52) U.S. Cl.
CPC .......... *G11C 16/3418* (2013.01); *G11C 8/08* (2013.01); *G11C 16/0483* (2013.01); *G11C 16/08* (2013.01); *G11C 16/10* (2013.01); *G11C 16/24* (2013.01); *G11C 16/26* (2013.01); *G11C 16/3459* (2013.01); *H01L 27/1157* (2013.01);
(Continued)

(58) Field of Classification Search
CPC . G11C 16/3431; G11C 16/10; G11C 16/3459; G11C 16/0483; G11C 16/08; G11C 16/24; G11C 16/3418
See application file for complete search history.

(56) References Cited

U.S. PATENT DOCUMENTS

| | | | |
|---|---|---|---|
| 7,064,981 B2 | 6/2006 | Roohparvar | |
| 7,180,787 B2 | 2/2007 | Hosono et al. | |

(Continued)

OTHER PUBLICATIONS

Kim et al. "11.4 A 512Gb 3b/cell 64-stacked WL 3D V-NAND flash memory," 2017 IEEE International Solid-State Circuits Conference Feb. 5-9, 2017, 3 pages.

(Continued)

*Primary Examiner* — Vanthu T Nguyen
(74) *Attorney, Agent, or Firm* — Haynes Beffel & Wolfeld LLP

(57) ABSTRACT

A programming operation for high density memory, like 3D NAND flash memory, modifies the waveforms applied during program operations to mitigate unwanted disturbance of memory cells not selected for programming during the operation. Generally, the method provides for applying a bias arrangement during an interval of time between program verify pass voltages and program pass voltages in a program sequence that can include a soft ramp down, and pre-turn-on voltages designed to reduce variations in the potential distribution on floating channels of unselected NAND strings during a program operation.

17 Claims, 13 Drawing Sheets

(51) Int. Cl.
  *G11C 16/26* (2006.01)
  *G11C 8/08* (2006.01)
  *H01L 27/11556* (2017.01)
  *H01L 27/11582* (2017.01)
  *H01L 27/1157* (2017.01)
  *H01L 27/11524* (2017.01)

(52) U.S. Cl.
  CPC ... *H01L 27/11524* (2013.01); *H01L 27/11556* (2013.01); *H01L 27/11582* (2013.01)

(56) References Cited

U.S. PATENT DOCUMENTS

| | | | | |
|---|---|---|---|---|
| 7,310,272 | B1 | 12/2007 | Mokhlesi et al. | |
| 7,606,079 | B2 | 10/2009 | Sekar et al. | |
| 7,609,558 | B2 | 10/2009 | Hosono | |
| 9,431,062 | B2 * | 8/2016 | Park | G11C 8/08 |
| 10,304,549 | B2 * | 5/2019 | Lee | G11C 16/3431 |

OTHER PUBLICATIONS

Kim et al., "Down-Coupling Phenomenon of Floating Channel in 3D NAND Flash Memory," IEEE Electron Device Letters IEDM vol. 37, Isssue 12, Oct. 20, 2016 pp. 1566-1569.

Lee et al—"A 1Tb 4b/cell 64-stacked-WL 3D NAND flash memory with 12MB/s program throughput," 2018 IEEE International Solid-State Circuits Conference—(ISSCC), Feb. 11-15, 2018, 3 pages.

Tsai et al., "Polycrystalline-silicon channel trap induced transient read instability in a 3D NAND flash cell string," 2016 IEEE Devices Meeting (IEDM), Dec. 3-7, 2016, 1.3.1-11.3.4.

Zhang, et al., "A Novel Read Scheme for Read Disturbance Suppression in 3D NAND Flash Memory," IEEE Electron Device Letters IEDM vol. 38, Issue 12, Oct. 23, 2017, pp. 1669-1672.

Yamashita et al. "11.1 A 512Gb 3b/cell flash memory on 64-word-line-layer BiCS technology," 2017 IEEE International Solid-State Circuits Conference (ISSCC), Feb. 5-9, 2017, 3 pages.

* cited by examiner

NAND FLASH OPERATING TECHNIQUES MITIGATING PROGRAM DISTURBANCE

PRIORITY APPLICATION

This application claims the benefit of U.S. Provisional Patent Application No. 62/745,152 filed 12 Oct. 2018; which application is incorporated herein by reference.

BACKGROUND

Field

The present invention relates to high density memory design, including 3D NAND memory design, configured to reduce interference as a result of the programming operation on selected memory cells that can disturb data stored in other memory cells in the array.

Description of Related Art

High density integrated circuit memory, including 3D NAND flash, is being developed to reduce the cost of data storage. In order to achieve this result, the size of the memory cells is shrinking, and the density of the arrays is increasing. These memory structures are complex and, as a result, electric fields created during operation interfere with or disturb the charge stored in memory cells that are not subject of the operation. These so-called program disturb and read disturb effects can reduce the reliability and endurance of the memory, or require large operating margins.

The density of data storage is also being addressed by implementing multilevel cells MLC which can store 2 bits or 3 bits (triple level cells) per cell. These multiple level cells require structures and procedures to support multiple threshold voltage ranges with narrow margins. These narrow margins exacerbate the problems with disturbance or interference with the charge stored in the memory.

Accordingly, it is desirable to provide methods for operating high density memory which can reduce the tendency to cause unwanted disturbance of the data stored in memory cells in high density memory.

SUMMARY

Technology described herein provides for modifying the waveforms applied during program operations to mitigate unwanted disturbance of memory cells not selected for programming during the operation. Generally, the technology provides for applying a bias arrangement during an interval of time between program verify pass voltages and program pass voltages in a program sequence that can include a soft ramp down, pre-turn-on, or both, designed to reduce variations in the potential distribution on floating channels of unselected NAND strings during a program operation. Variations of the bias arrangement can be referred to as a soft ramp down (FIG. 7A), a 2-step ramp down (FIG. 8A), a pre-turn-on (FIG. 9A), a 2-step ramp down with pre-turn-on (FIG. 10A), a pre-turn-on "plus" (FIG. 11A) and a 2-step ramp down with a pre-turn-on "plus" (FIG. 12A).

It is found that bias arrangements in this interval can mitigate program disturb conditions on unselected NAND strings, enlarging the sensing margins available for use in high density memory.

Other aspects and advantages of the present invention can be seen on review of the drawings, the detailed description and the claims, which follow.

DETAILED DESCRIPTION

A detailed description of embodiments of the present invention is provided with reference to the FIGS. 1 through 12A-12B.

Figure 1:
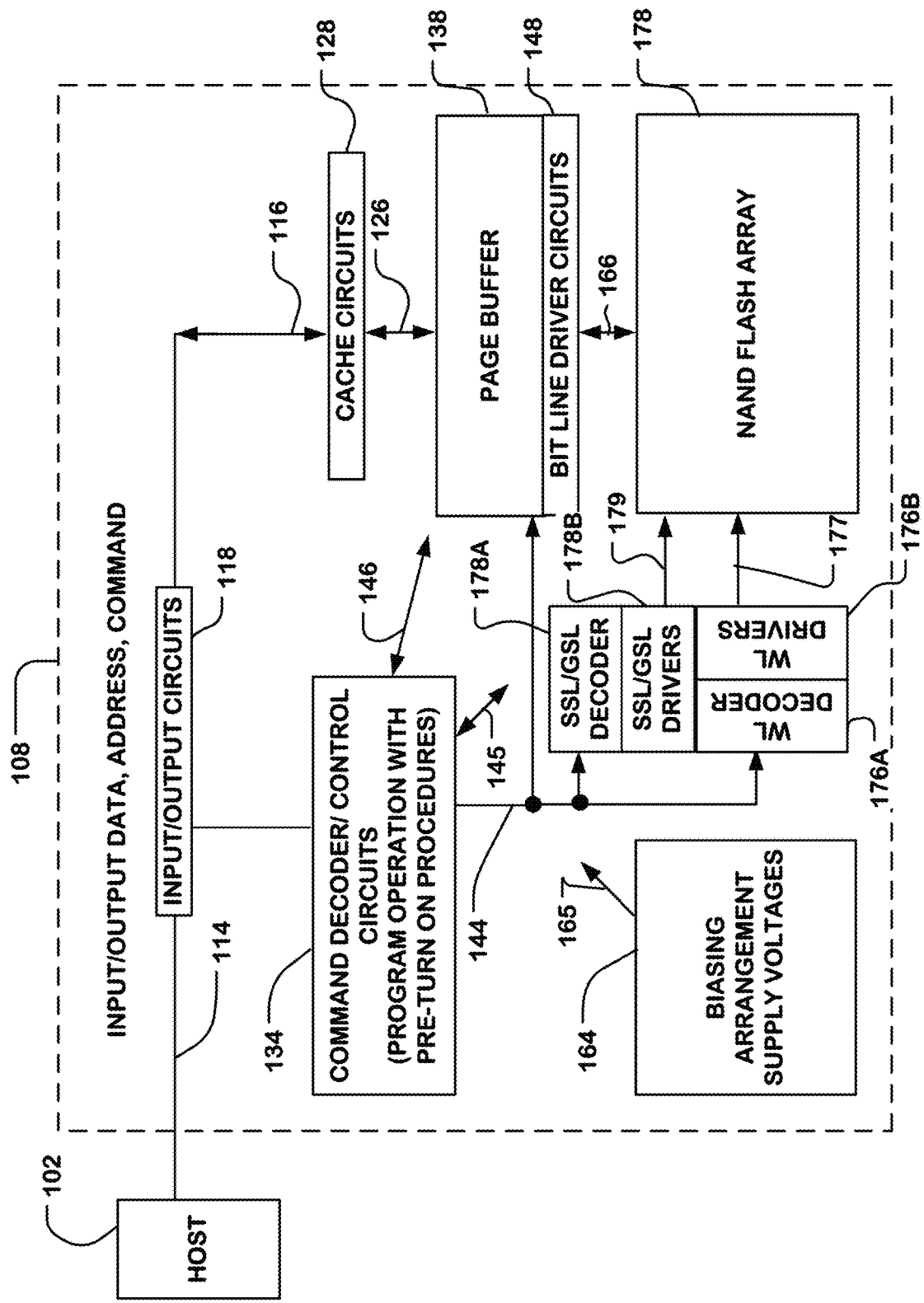
FIG. 1 is a simplified block diagram of a memory device and host including a NAND flash array and controller configured for bias procedures as described herein.

FIG. 1 is a simplified diagram of a memory system that includes a NAND flash memory device 108 implemented on an integrated circuit and a host 102 configured for memory operations, including page program, program, read, erase, or other operations. In various embodiments, the memory device 108 may have single-level cells (SLC), or multiple-level cells storing more than one bit per cell (e.g., MLC, TLC or XLC). The memory device can be implemented on a single integrated circuit chip, on a multichip module, or on a plurality of chips configured as suits a particular need.

The memory device 108 includes a memory array 178, which can be a NAND flash memory implemented using three-dimensional array technology. In some embodiments, the memory array 178 comprises an array of vertical NAND strings in a dense 3D configuration. In other embodiments the memory array 178 can comprise a two-dimensional array of NAND strings A word line decoder 176A is coupled via word line driver circuits 176B to a plurality of word lines 177 in the memory array 178. SSL/GSL decoder 178A is coupled via SSL/GSL driver circuits 178B by SSL and GLS lines 179, to bit line side (SSL) and common source side (GSL) string select gates in the array. Page buffer circuits 138 are coupled by bit line driver circuits 148 to bit lines 166 in the memory array 178. In some embodiments, column decoder circuits can be included for routing data from the bit line drivers to selected bit lines. The page buffer circuits 138 can store pages of data that define a data pattern for a page program operation, and can include sensing circuits used in read and verify operations Bit lines for memory arrays can comprise global bit lines (GBL) and local bit lines. Bit lines generally comprise conductors in higher patterned layers that traverse a plurality of blocks of memory cells in an array, and connect to local bit lines in the blocks via block select transistors or bank select transistors. The local bit lines are connected to the memory cells for current flow to and from the bit lines, which in turn are connected to the bit line driver circuits 148 and page buffer circuits 138. Likewise, the word lines can include global word lines and local word lines with corresponding supporting circuits in the word line drivers 176B.

In a sensing operation, sensed data from the page buffer circuits 138 are supplied via second data lines in bus system 126 to cache circuits 128, which are in turn coupled to input/output circuits 118 via data path lines 116. Also, input data is applied in this example to the cache circuits 128 on lines 116, and to the page buffer circuits 138 on bus system 126, for use in support of program operations.

Input/output circuits 118 are connected by line 114 (including I/O pads) and provide communication paths for the data, addresses and commands with destinations external to the memory device 108, including the host 102 in this example. The input/output circuits 118 provide a communication path by line 116 to cache circuits 128 which support memory operations. The cache circuits 128 are in data flow communication (using for example a bus system 126) with page buffer circuits 138.

Control circuits 134 are connected to the input/output circuits 118, and include command decoder logic, address counters, state machines, timing circuits and other logic circuits that control various memory operations, including program, read, and erase operations for the memory array 178. Control circuit signals are distributed to circuits in memory device, as shown by arrows 145, 146, as required to support the operations of the circuits. The control circuits 134 can include address registers and the like for delivery of addresses as necessary to the components of the memory device 108, including delivery to the cache circuits 128, and on line 144 to the page buffer circuits 138, word line decoder 176A and SSL/GSL decoder 178A in this illustration.

In the example shown in FIG. 1, control circuits 134 include control logic circuits that include modules implementing a bias arrangement state machine, or machines, which controls, or control, the application of bias voltages generated or provided through the voltage supply or supplies in block 164, such as read, erase, verify and program voltages including precharge voltages, pass voltages and other bias voltages as described herein to word line driver circuits 176B and bit line driver circuits 148, for a set of selectable program and read operations. Bias voltages are applied as represented by arrow 165, to components of the memory device 108, as necessary for support of the operations. As described in more detail below, the control circuits 134 include logic to implement bias arrangements that mitigate production of hot electrons in channels of unselected NAND strings, such as by applying "pre-turn-on" bias between program verify pulses and program pulses of a program sequence.

The control circuits 134 can include modules implemented using special-purpose logic circuitry including state machines, as known in the art. In alternative embodiments, the control circuits 134 can include modules implemented using a general-purpose processor, which can be implemented on the same integrated circuit, which execute a computer program to control the operations of the memory device 108. In yet other embodiments, a combination of special-purpose logic circuitry and a general-purpose processor can be utilized for implementation of modules in control circuits 134.

The flash memory array 178 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 102 is coupled to lines 114 on the memory device 108, as well as other control terminals not shown, such as chip select terminals and so on, and can provide commands or instructions to the memory device 108. In some examples, the host 102 can be coupled to the memory device using a serial bus technology, using shared address and data lines. The host 102 can comprise a general purpose processor, a special purpose processor, a processor configured as a memory controller, or other processor that uses the memory device 108. All or part of the host 102 can be implemented on the same integrated circuit as the memory.

The host 102 can include a file system or file systems that store, retrieve, and update data stored in the memory based on requests from an application program. In general, the host 102 can include programs that perform memory management functions and other functions that can produce status information for data stored in the memory, including information marking data invalid as a result of such functions. Such functions can include for example wear leveling, bad block recovery, power loss recovery, garbage collection, error correction, and so on. Also, the host 102 can include application programs, file systems, flash translation layer programs and other components that can produce status information for data stored in the memory, including information marking data invalid as a result of such functions.

In high density memory, a page can comprise hundreds or thousands of bits, and a page buffer can be connected in parallel to the corresponding hundreds or thousands of bit lines. During program operations, for example, one set of bit lines, a word line and an SSL line are selected to be biased for programming a particular data pattern that is defined by contents of the page buffer circuits 138, and a different set of bit lines is selected to be biased to inhibit programming according to the particular data pattern.

Figure 2:
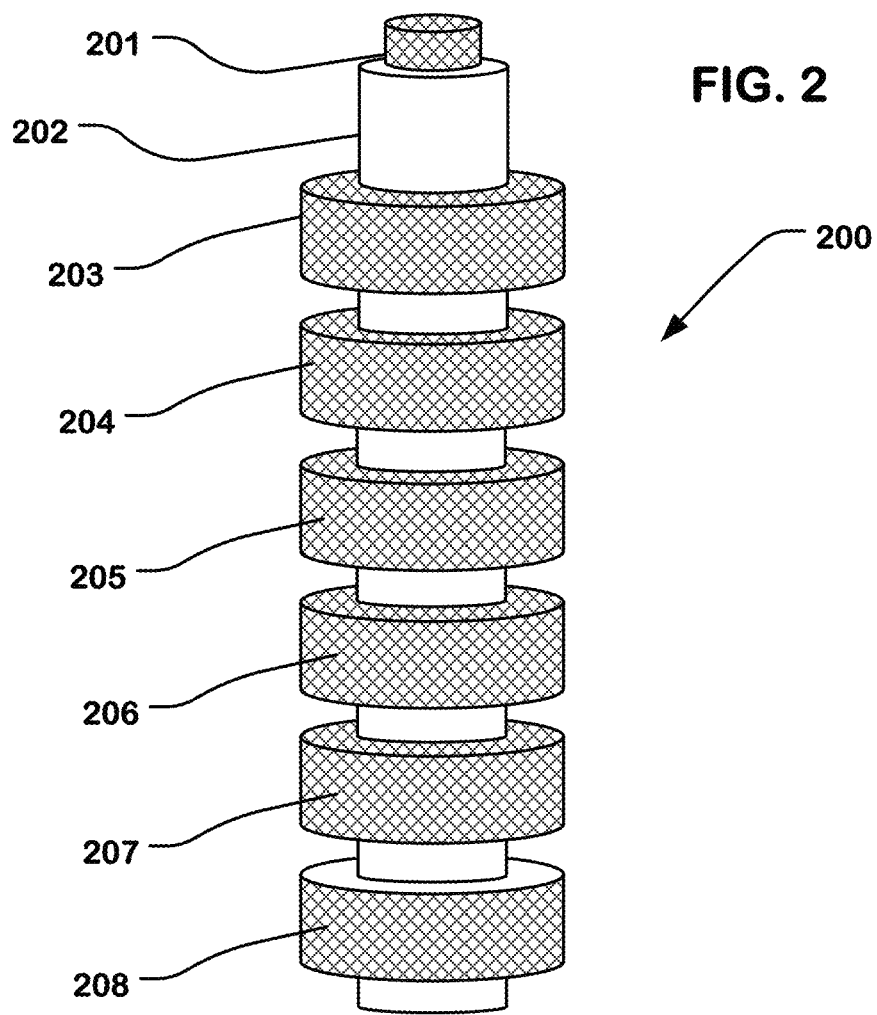
FIG. 2 is an illustration of one example of the vertical NAND string structure which can be utilized in a device such as shown in FIG. 1.

FIG. 2 illustrates one example of a vertical NAND string 200, which can be configured in a high density array. The vertical NAND string 200 includes a vertical channel structure including a semiconductor channel 201 which is surrounded by a data storage layer 202, such as a dielectric charge trapping layer or floating gate layer. A plurality of levels of patterned conductors form string select gates (e.g. SSL gate 203, the GSL gate is not shown) and word lines (204 through 208 in this example) on the NAND string. The vertical NAND string 200 can be referred to as a gate-all-around GAA NAND string, because the vertical channel structure penetrates the patterned conductor layers. In a high density embodiment, a single patterned conductor can act as a word line for a large number of vertical channel structures as discussed in more detail below.

Other types of vertical NAND strings can be utilized, including single gate and double gate cells in which the vertical channel structures are disposed in trenches between patterned conductor lines, and may not be completely surrounded by the conductor acting as a word line.

In operation, the data storage layer 202 is configured to trap charge which causes changes in threshold voltage Vt of the corresponding cells. These changes in threshold voltage represent data values which can be programmed, erased, and read. In some embodiments, the memory cells store one bit of data each. In some embodiments, the memory cells are multilevel cells, which can store multiple bits of data. For example, the memory cells can be configured to operate with four threshold voltage levels representing 2 bits of data. Others can be configured to operate with 8 or 16 threshold voltage levels representing more bits of data per cell.

Figure 3:
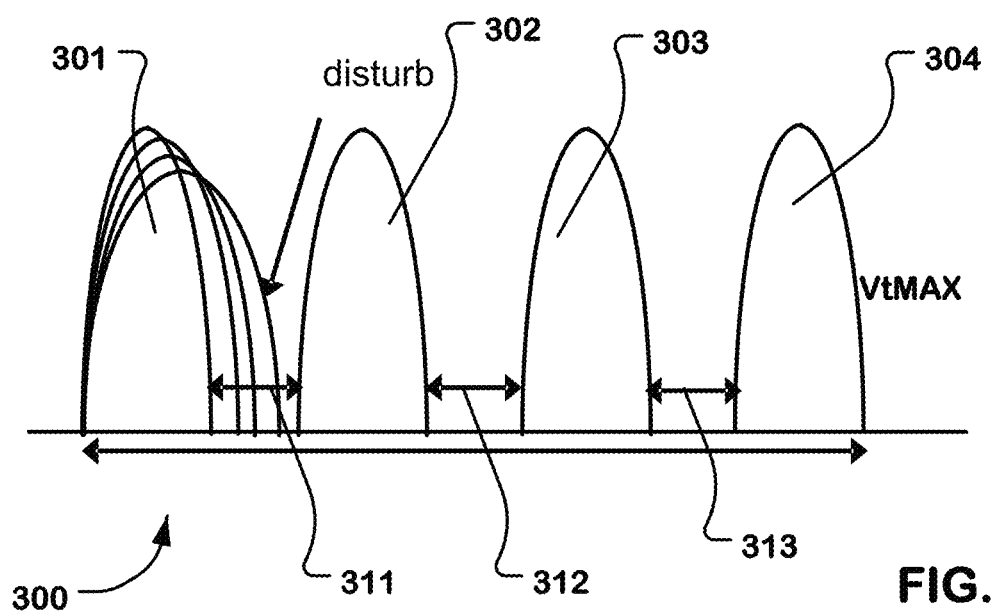
FIG. 3 illustrates distribution of threshold voltages implemented for a 2-bit per cell memory device, which can be utilized in memory as described herein.

FIG. 3 is a graph showing a distribution of threshold voltages for a 4-level cell. Thus, the cell can be configured to have an erased state with a threshold in the range 301. A second state can have a threshold in the range 302. A third state can have a threshold in the range 303. A fourth state can have a threshold in the range 304. In order to be able to sense the different threshold ranges, the system is configured so that a sensing margin 311, 312, 313 is established between the threshold ranges. In a memory cell, the maximum threshold corresponding to data is the threshold VtMAX at the upper part of range 304, having the highest threshold voltages in the distribution of threshold levels with which the cell in operated.

One problem that can have increased complexity in high density vertical NAND memory, like that of FIG. 2, relates to disturbance of the charge in one memory cell that can be caused by operations that are directed to other memory cells in the array. Thus, as illustrated in FIG. 3, a memory cell in the array state might be inadvertently exposed to electric fields that increase the charge trapped in the memory cell, and thereby increase the threshold voltage. This is a result of spreading the distribution of threshold voltages for cells situated in an erased state or lower threshold voltage state. As this disturbance increases, the operating sensing margin 311 is reduced.

Figure 4:
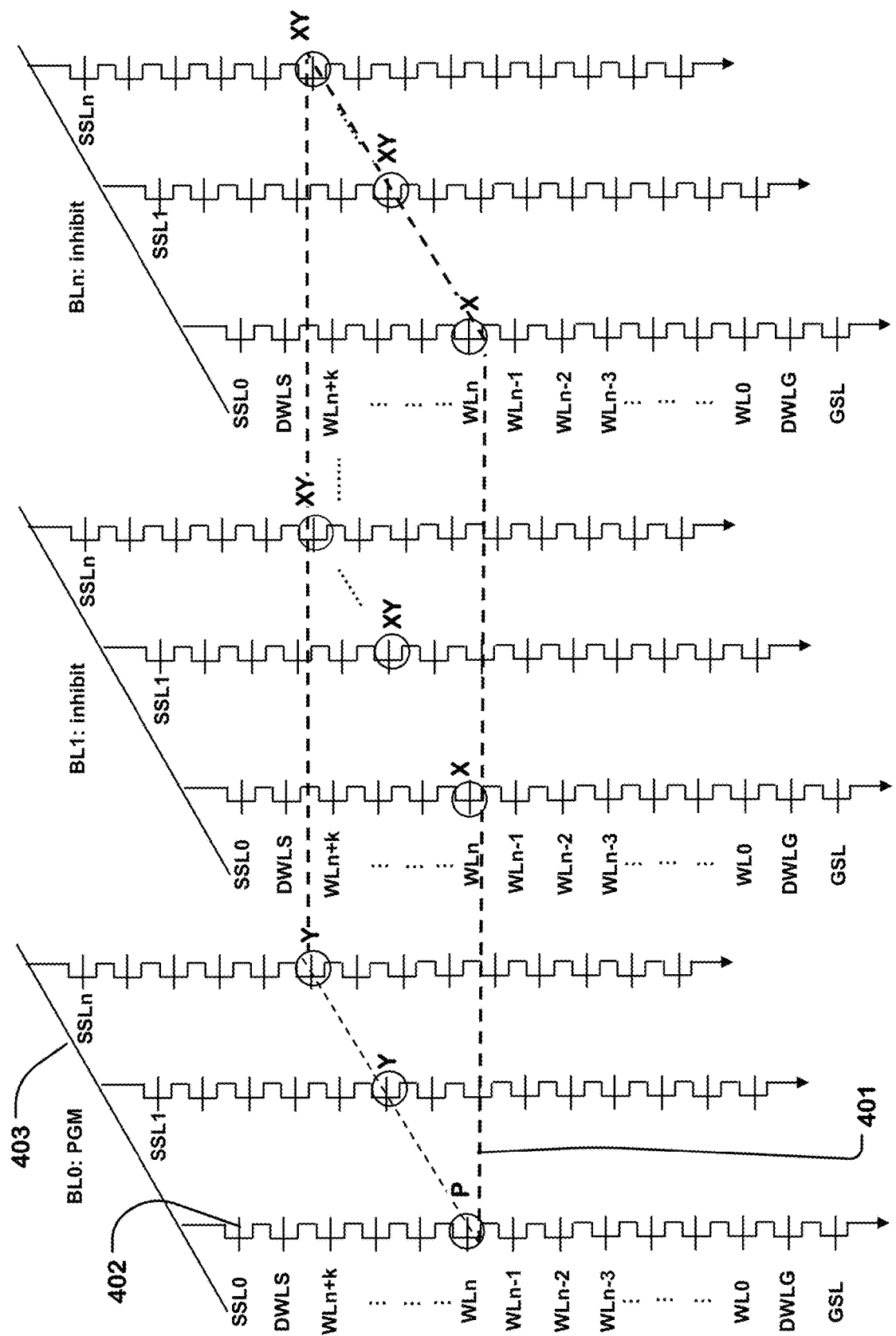
FIG. 4 is an equivalent circuit diagram of a block in a 3D vertical NAND memory device suitable for use in the system of FIG. 1.

FIG. 4 is a diagram of an equivalent circuit for a 3D vertical NAND flash array. In this example, 9 vertical NAND strings are illustrated. The plurality of levels of word lines WL0 to WLn+k in this example is illustrated. All of the vertical NAND strings in this block share a single word line. Also, each of the NAND strings includes a bit line side select gate which is coupled to a string select line. In this illustration, each string select line (SSL0, SSL1, SSL2) is coupled to 3 of the vertical NAND strings in the 9-string array. Also, each of the NAND strings includes a source side select gate, which is coupled to a second string select line GSL. In this example, all of the second string select lines are coupled to a single second string select line GSL which controls connection or disconnection of the NAND string to the common source line for the block.

In order to select a particular cell, a single top string select gate (e.g. 402 SSL0) is selected, a single word line (e.g. 401, WLn) is selected, and a single bit line (e.g. 403, BL0) is selected. For a page operation, a single top string select gate is selected, a single word line is selected, and a plurality of bit lines is selected.

For example, to program a data pattern in the page including the memory cell "P" in the circuit of FIG. 4, the string select line SSL0 is selected, the word line WLn is selected, and the bit lines BL0, BL1, BL2 are selected. To program only the memory cell "P," according to a data pattern stored in a page buffer, bit line BL0 will be biased for programming, and bit lines BL1 and BL2 will be set to inhibit programming. The word line WLn will receive a program sequence for a selected word line. The other word lines will receive a sequence for unselected word lines in support of the program sequence.

Electric fields created during the programming sequence can be complicated in a high density array. Memory cells (labeled X) on NAND strings that share the string select line SSL0 and word line WLn encounter one type of disturbance based on the word line bias applied to word line WLn and the operation of the string select gate in response to the SSL0 having dependence on the difference between the program and inhibit biases on the bit line. Memory cells (labeled Y) on NAND strings that share the bit line BL0 and word line WLn suffer a second type of disturbance based on the word line bias applied to the word line WLn, and operation of their respective string select gates in response to the SSL1 and SSL2 signals, while the bit line BL0 is biased for programming. Memory cells (labeled XY) on NAND strings share the word line WLn, but do not share either a bit line or a SSL line, and also encounter disturbance based on the word line bias.

Figure 5:
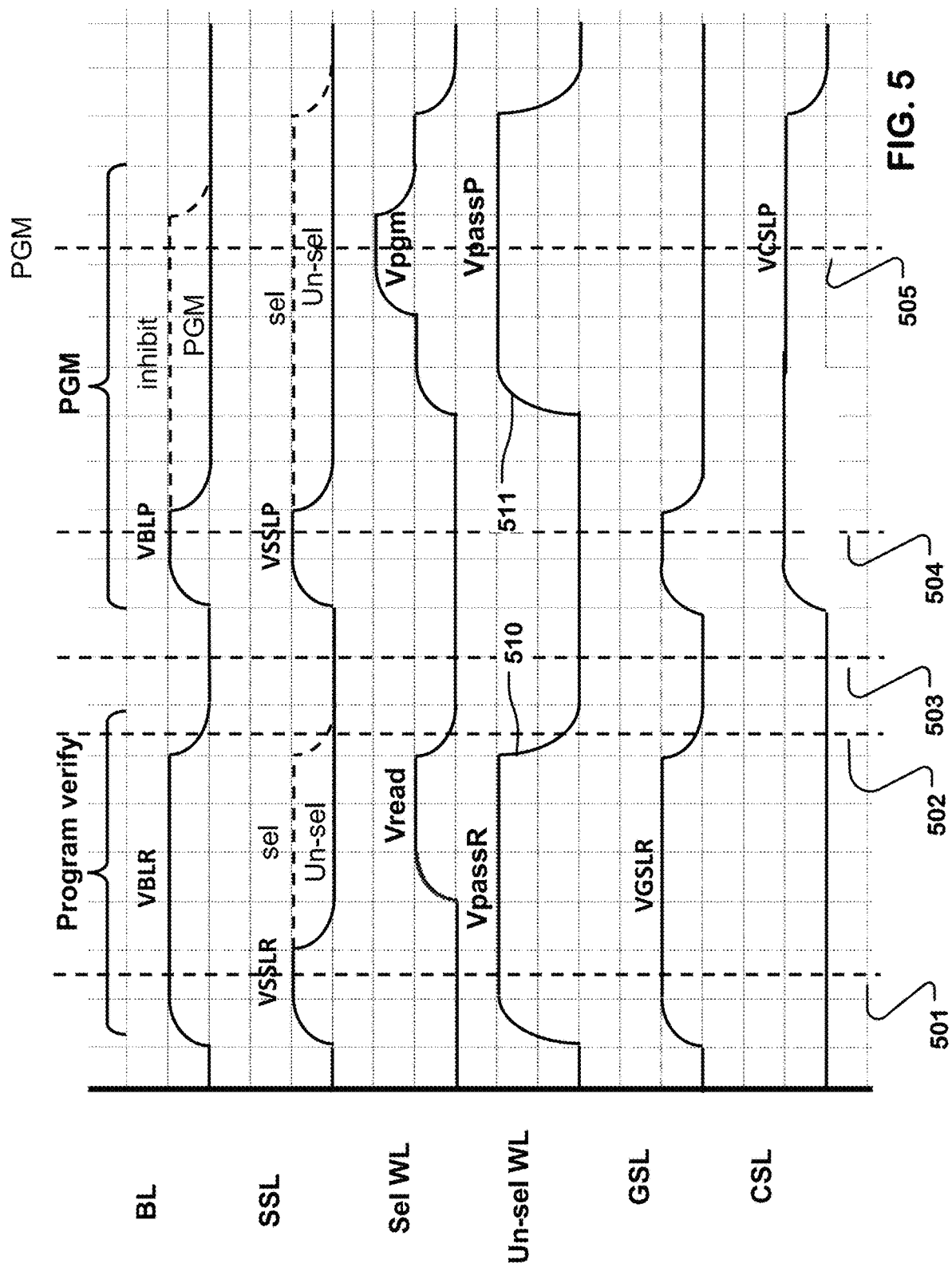
FIG. 5 is a timing diagram of a program sequence including a program verify procedure followed by a program procedure.

FIG. 5 is a timing diagram showing a bias arrangement for a page program operation in a 3D NAND like that of FIG. 3. A controller, such as that in FIG. 1 will execute a program sequence to apply voltages to the bit line BL, string select line SSL, selected word line Sel WL, on unselected word line Un-sel WL, ground select line GSL and common source line CSL of the block of vertical NAND strings. The program sequence includes a program verify procedure and a program PGM procedure, bracketed in the FIG. 5.

The program verify procedure includes a precharge interval (time 501), a sensing interval, and a recovery interval (time 502). In the precharge interval, the bit line voltage is raised to a bit line precharge voltage VBLR, the string select line is raised to VSSLR, the unselected word lines are raised to a pass voltage VpassR, and the ground select line is raised to a voltage VGSLR. This has the effect of charging the channel structure of the vertical NAND for the strings in the block. After the precharge interval, the SSL voltage transitions to a low level for unselected strings, and remains at a high level for selected strings. The bit line and the ground select line remain at the same level as the precharge interval in this example.

The unselected word line receives a verify pass voltage pulse that includes a step up corresponding with the start of the pre-charge interval, and a trailing edge 510 at which a step-down in voltage to ground occurs. The step-down can have a rate of decrease or ramp down that is relatively quick. The trailing edge 510 occurs at a time that corresponds to the end of the program verify read, within such requirements as suits a particular program procedure.

The selected word line receives a read voltage Vread pulse. Sensing circuits (not shown) can detect current flow in the bit line based on the threshold of the selected cell for the purposes of verifying a programmed state. At the end of the read pulse, the voltage is recovered to ground level on each of these lines at a recovery time 502. After the verify is finished, at time 503, the voltages should be fully returned to the ground state, in this example.

The program procedure includes a precharge interval (time 504), and a programming interval (time 505). At the beginning of the program procedure, the bit line is raised to a precharge level VBLP for program, and the string select line is raised to a string select level VSSLP for program. At the same time, the ground select line GSL is raised to a ground select level for program, and the common source line CLS is raised to the voltage VCSLP. This turns on the string, and is connected to the bit line and common source line to precharge the channel structure in the page to a precharge level. After the precharge step, the voltages are returned to a ground level, with the exception of the common source line in this example. The bit line assumes a value based on the data pattern in the page buffer, corresponding to an inhibit value which in this example is a higher voltage, and a program value which in this example is a ground voltage. Also the string select lines assume values based on the selected page, including a higher voltage select value and a lower voltage unselected value. Next, a program pulse and a pass voltage pulse are applied to the selected word line and unselected word line, respectively. The program pass voltage pulse has a leading edge 511 at which a step-up in voltage to VpassP occurs. The step-up can have a rate of increase or ramp up that is relatively quick. The leading edge 511 occurs at a time that corresponds to the leading edge of the program pulse, within such requirements as suits a particular program procedure. The program pulse in this example includes a 2-stage pulse, raising to a first level and holding that interval for a period of time, and then increasing to a high voltage Vpgm. The pass voltage pulse in this example raises to a constant VpassP voltage for the duration of the program interval. This has the result of establishing a strong electric field on the cell at the selected word line, selected bit line, and selected page, while inhibiting formation of a strong electric field in the unselected cells.

The inhibited strings have their select gates (SSL gates and GSL gates) turned off by this bias arrangement for the program procedure. As a result, the channel structures are floating during the application of the word line voltages on the selected and unselected lines. The floating channel structures are boosted by capacitive coupling of the word line voltages, which prevents the formation of strong electric fields on the unselected strings.

NAND flash memories are often operated in a manner that enforces an order to the programming of memory cells in the string. For example, the first page programmed in the order will be the first word line WL1, and the order will proceed in sequence until the last word line. This order is adjusted at times for the purposes of supporting multilevel programming. But, nonetheless, it proceeds in general in a specific order. Variations in the threshold of the memory cells along the channel can cause variations in the coupling efficiency for the unselected strings along the channel. Therefore, when programming a particular word line WLn, one scenario includes the situation in which one or more adjacent word lines earlier in the order (WLn−1, WLn−2, . . . ) has been programmed to a high threshold state. In some examples, this can be the highest threshold state VtMAX for the memory cells in the array. It is found that this is a condition in which variations in the coupling efficiency can result in lateral electric field along the channel near the selected word line WLn during the capacitive boosting. These lateral electric fields can result in generation of hot electrons in the vicinity of the selected word line on which the program pulse is applied. These hot electrons can disturb memory cells on unselected strings.

Figure 6A:
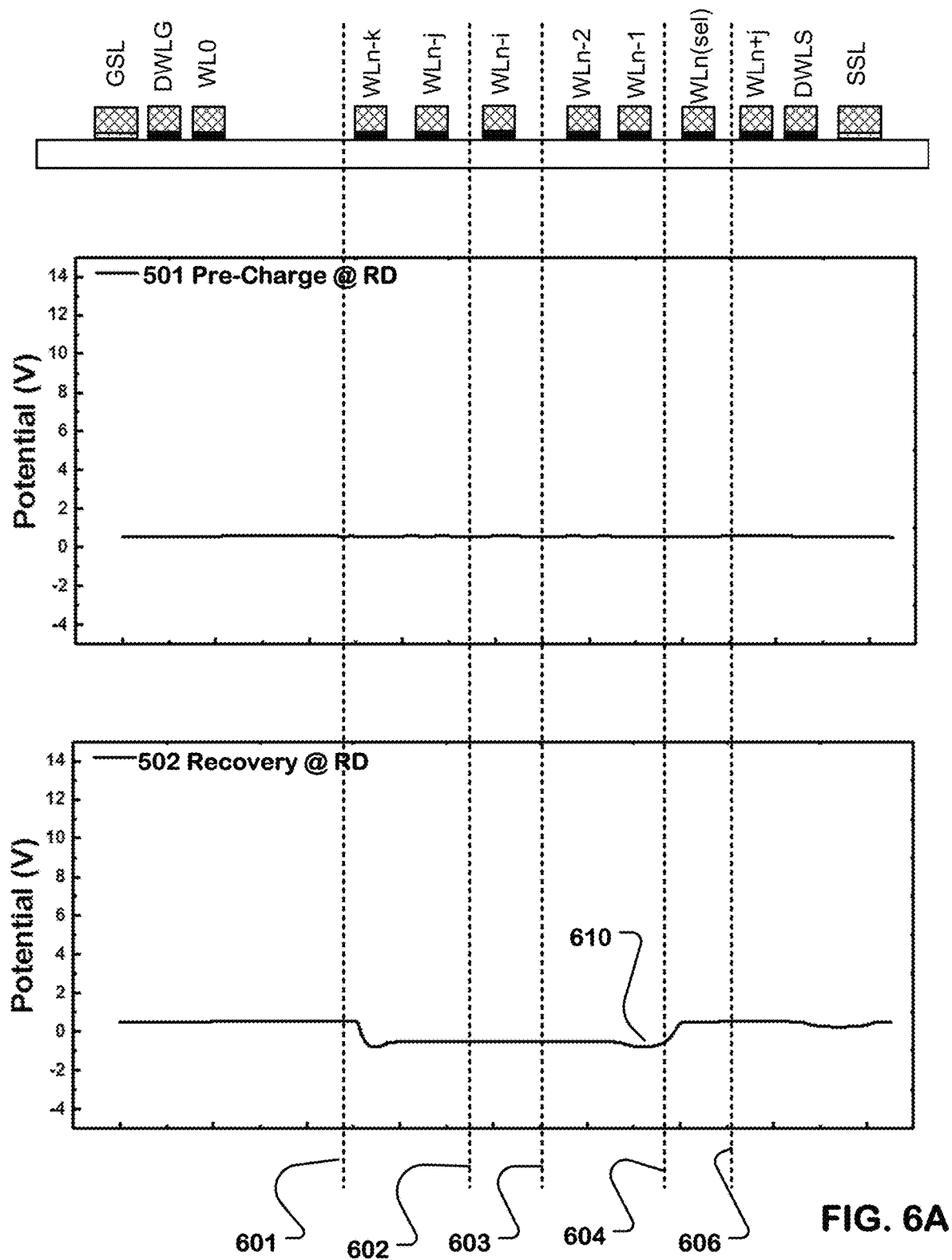
FIGS. 6A, 6B, 6C illustrate a simulation of the channel potential along the length of a vertical NAND string during the program sequence of FIG. 5.
Figure 6B:
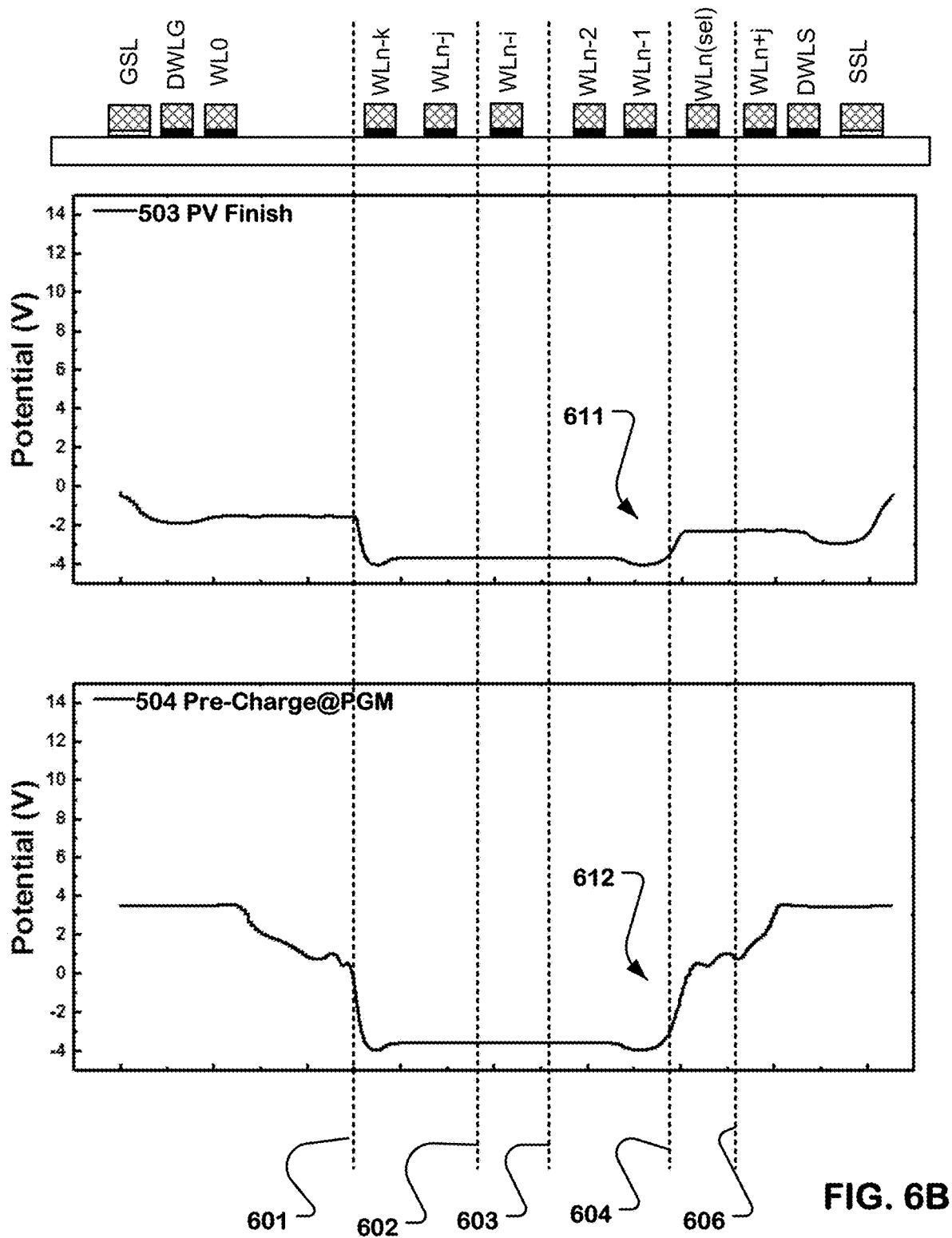
Figure 6C:
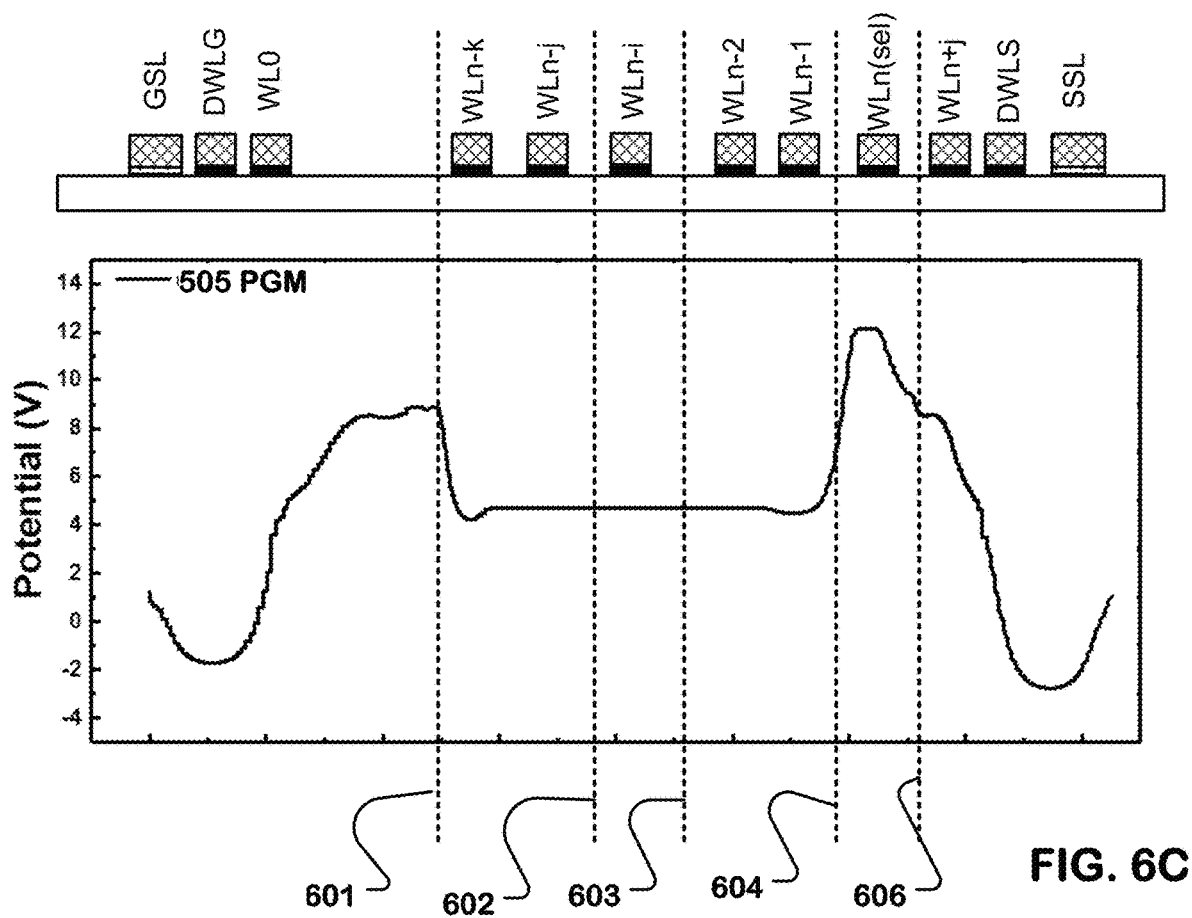

FIGS. 6A-6C illustrate results of a simulation of the channel voltages on and unselected string for a bias arrangement like that of FIG. 5. In FIG. 6A, a NAND string is illustrated along the upper part of the Figure, including the ground select gate GSL, a ground side dummy word line DWLG, word lines WL0 to WL n+j, a bit line side dummy word line DWLS, and a string select line SSL. The selected word line is labeled WLn and is disposed roughly between the lines 604, 606. Adjacent word lines earlier in the programming order are labeled WLn−2 and WLn−1 and are disposed roughly between the lines 603 and 604. Other word lines WLn−i, WLn−j, WLn−k and WL0 are illustrated, and can have various threshold voltages. For the purposes of the simulation, the word lines WLn−2 and WLn−1 are assumed to have the maximum threshold voltage VtMAX for the memory, making the conductance of the channel structure in the region of these word lines relatively low.

In FIG. 6A, simulations corresponding to time 501 (see FIG. 5) during the precharge interval for the verify read, and corresponding to time 502 during the precharge recovery interval during the verify read, are illustrated. During precharge, it can be seen that the potential along the channel of the unselected string is relatively level near ground voltage. After the precharge pulses are applied, the potential during recovery shows a dip 610 in the region of the high threshold cell on word line WLn−1 and near the selected word line WLn. This dip 610 may correspond for example to the drop in voltage on the trailing edge of the pass voltage pulse VpassR.

In FIG. 6B, simulations corresponding to the time 503 at the finish of the program verify, and time 504 during the precharge interval for program, are illustrated. At the time 503, the voltage level has been further boosted downward by the drop in the voltage at the end of the pass voltage pulse on the unselected word line, maintaining a dip in voltage 611. This dip 611 in voltage establishes a lateral electric field tending to drive electrons toward the channel of the cell at the selected word line. At the time 504, during the precharge pulse, the potential under the selected word line increases due to conduction from the low threshold cells between the selected word line and the bit line, while the high threshold cells under word lines WLn−1 and WLn−2 remain nonconductive and can have a relatively low potential. This increases the lateral field in the region 612.

In FIG. 6C, the simulation corresponding to time 505 is shown at the time of the program pulse. At this time, the channel is floating, and the program pulse boosts the voltage under the selected word line to a higher level than the voltage under the unselected word lines. This creates a vertical electric field in the region of the selected word line, which is complemented by the lateral electric field that provided hot electrons. This can result in disturbance of the memory cell at the selected word line, even when it is in an inhibited or unselected string.

Although the amount of disturbance in any one program pulse may be relatively small, as the number of program pulses applied to the memory cell while it is unselected increase, the threshold shift can be significant, resulting in loss of data. For example, in a 3D NAND array having memory cells storing 3 bits, it would not be uncommon for an unselected string in a memory block to be subjected to hundreds of program pulses during a program operation for a page.

FIGS. 7A-7B, 8A-8B, 9A-9B, 10A-10B and 11A-11B illustrate improvements to a program sequence which can reduce the formation of lateral fields adjacent unselected word lines in unselected strings. These sequences are applied to unselected word lines, including at least one unselected word line adjacent to a selected word line. In some embodiments, for programming a selected word line WLn, these sequences can be applied to the adjacent word lines WLn−1 to WLn−k, where k can be an integer from 1 to 3 or more. In some embodiments, these sequences may be applied to all the word lines earlier in the programming order, for example. Of course, other combinations of unselected word lines may receive bias arrangements of this type, depending on the particular physical array configuration, and programming operations being utilized.

As illustrated in these figures, the program sequence includes applying a bias voltage to at least one unselected word line and a time interval between a trailing edge of the verify pass voltage pulse (VpassR) and a leading edge of the program pass voltage pulse (VpassP), referring to the timing diagram of FIG. 5. The bias voltage tends to turn on a cell or cells in the at least one unselected word line during the time interval leading up to the program pulse on the selected word line. A bias voltage for the purposes of this description tends to turn on a cell, when the voltage tends to increase the gate-to-channel voltage on the cell. For a multilevel cell, which can have a maximum threshold voltage VtMAX that represents a data value, in one embodiment, the voltage applied can be greater than VtMAX.

This bias voltage can increase conductance in the channel below the high Vt cell, modifying the capacitive coupling efficiency, and promoting charge sharing along the channel to level out the distribution of voltage potential, reducing lateral electric fields and reducing disturbance of the charge stored in the memory cells on the string. Also, the bias voltage can have transitions ("soft ramp down") that tend to affect the capacitive boosting taking place in the region of the high Vt cell to reduce the generation of lateral electric fields.

Figure 7A:
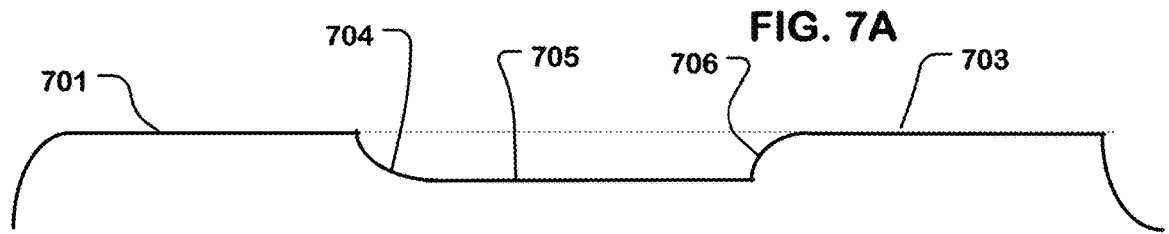
FIGS. 7A-7B illustrate a first example of a bias arrangement as described herein, and simulation of the channel potential as a result of the bias arrangement.

FIG. 7A illustrates a first example of a bias arrangement, referred to as a soft ramp down bias arrangement, in the interval of time between a program verify pass voltage pulse and a program pass voltage pulse. The arrangement includes a program verify pass voltage pulse 701 having a trailing edge, and a program pass voltage pulse 703 having a leading edge 706. At the trailing edge of verify the pass voltage pulse, the bias voltage comprises the step-down 704 to an intermediate bias voltage level 705, and holds the bias voltage level 705 until a leading edge 706 of the program pass voltage pulse 703, without returning to a lower reference voltage such as ground in this example.

Figure 7B:
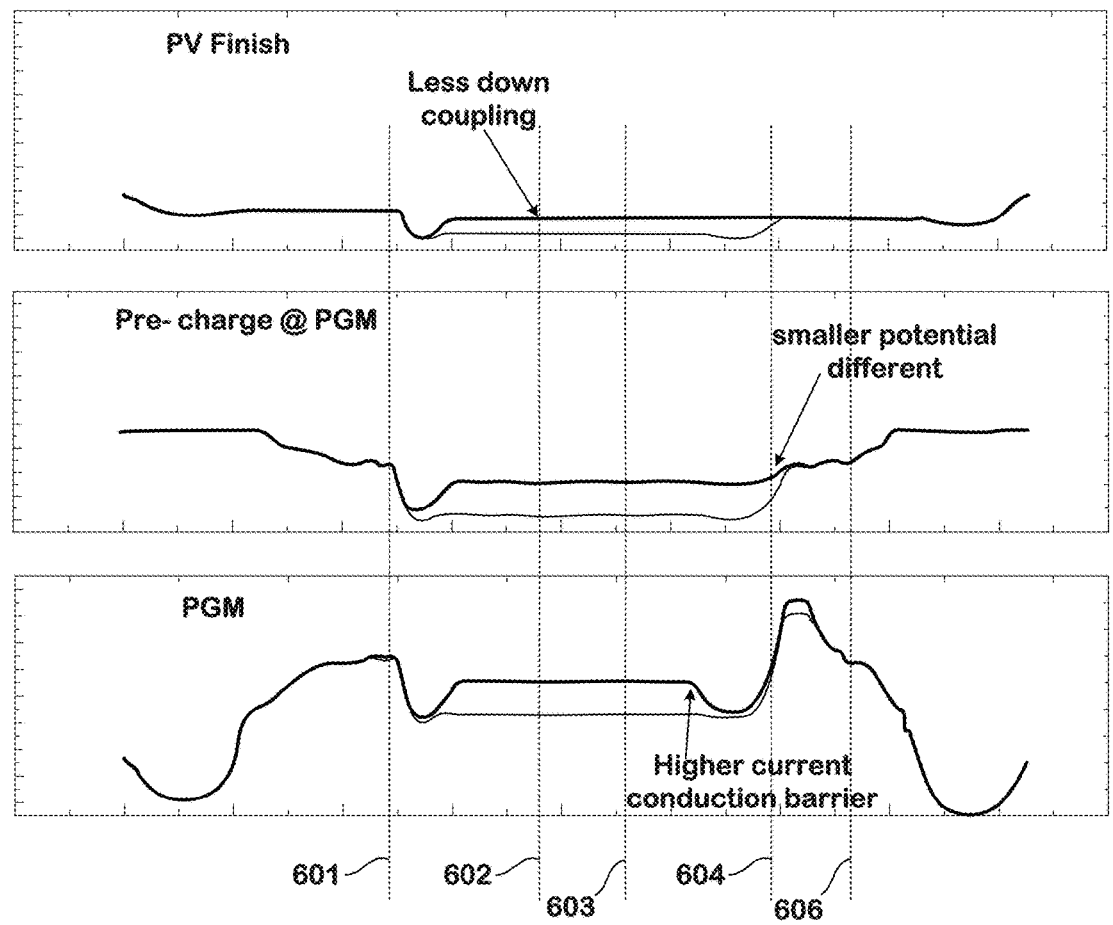

FIG. 7B illustrates a simulation at the program verify finish time (e.g. 503), the precharge program time (e.g. 504), and the program time (e.g. 505). The vertical lines 601-604 and 606 correspond roughly with those lines shown in FIGS. 6A-6C, illustrating the spatial relationship with the word lines in the unselected string. Each simulation includes the potential along the channel line for the bias arrangement shown in FIG. 5 (lower trace), and for the modified arrangement shown in FIG. 7A (upper trace). As illustrated, during the program verify finish time, as a result of the step-down at transition at the ramp 704 being less than the transition at the trailing edge of the verify pass voltage pulse 701 in the conventional arrangement, there is less down-coupling of the potential in the region of the high threshold cells. During the precharge for program time, because of the higher intermediate bias voltage on the high threshold cells, there is more charge sharing along the channel, resulting in more charge sharing along the line from the low threshold cells above the selected cell.

During the program pulse, as a result of the program pass voltage pulse, the channel line is boosted up. However, in the region between the selected cell and the high threshold cell, a dip in potential results. This dip in potential creates a conduction barrier for electrons mitigating injection of hot electrons into the region of the selected word line. As result, less disturbance of the charge in the cell at the selected word line results.

Figure 8A:
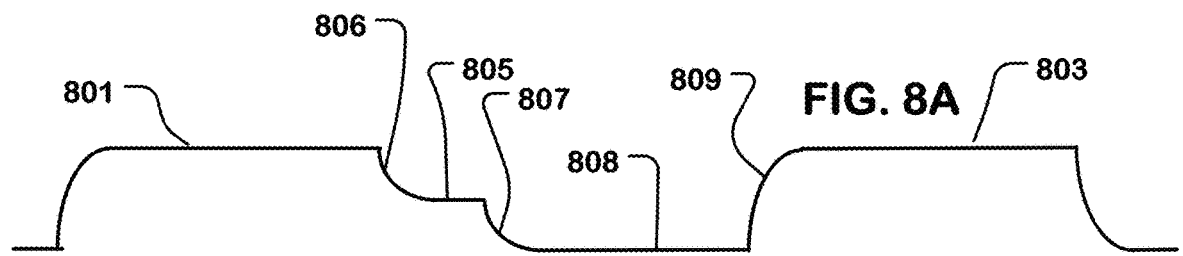
FIGS. 8A-8B illustrate a second example of a bias arrangement as described herein, and simulation of the channel potential as a result of the bias arrangement.

FIG. 8A illustrates a second example of a bias arrangement. The arrangement includes a program verify pass voltage pulse 801, and a program pass voltage pulse 803 having a trailing edge and leading edge respectively. In this example, the bias arrangement applied to the unselected word line includes the pass voltage during the program verify operation, during which the voltage is increased to a voltage level 801 corresponding to the read pass voltage. At the end of the read pass voltage pulse, the bias voltage comprises a step-down 804 from the trailing edge of the verify pass voltage pulse to an intermediate bias voltage level 805, which can be a bias voltage greater than or equal to the maximum threshold voltage VtMAX for the programmed cell. Then, the intermediate voltage is held for part of the interval between the trailing edge of the program verify voltage pulse and the leading edge of the program pass voltage pulse. The bias voltage includes a step-down 807 to a lower voltage level 808 such as ground before the step-up at leading edge 809 of the program pass voltage pulse.

Figure 8B:
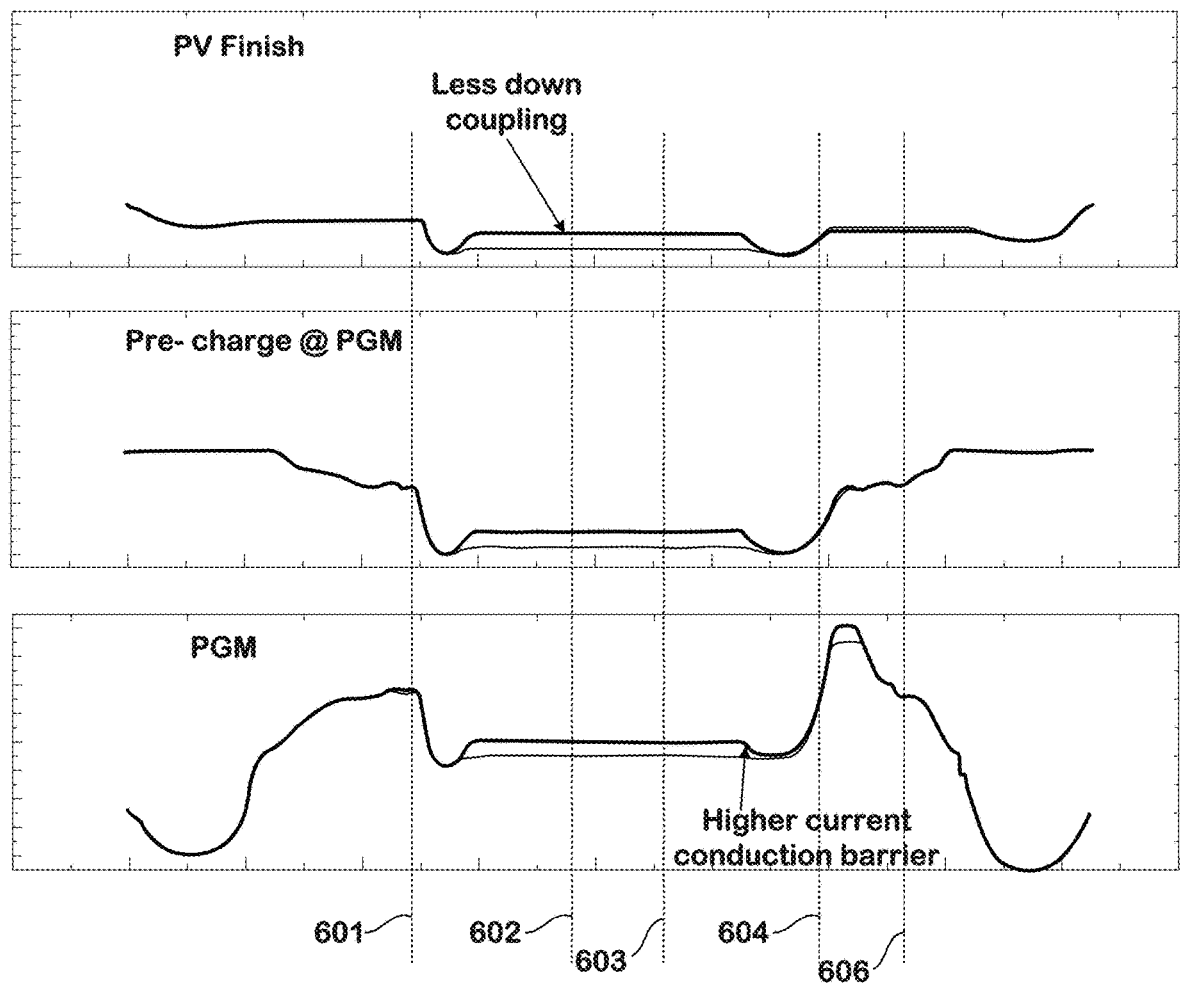

The simulations shown in FIG. 8B show that, like the embodiment of FIG. 7A, there is less down-coupling at the end of the program verify operation than during the precharge operation for the program procedure. During the program procedure, a current conduction barrier is formed mitigating lateral movement of electrons into the region of the selected word line. The potential in the high threshold cells adjacent the selected word line is slightly lower than that of the embodiment of FIG. 7A because of less conduction due to the lower voltage at level 808 during the precharge interval from the low threshold cells above the selected word line.

Figure 9A:
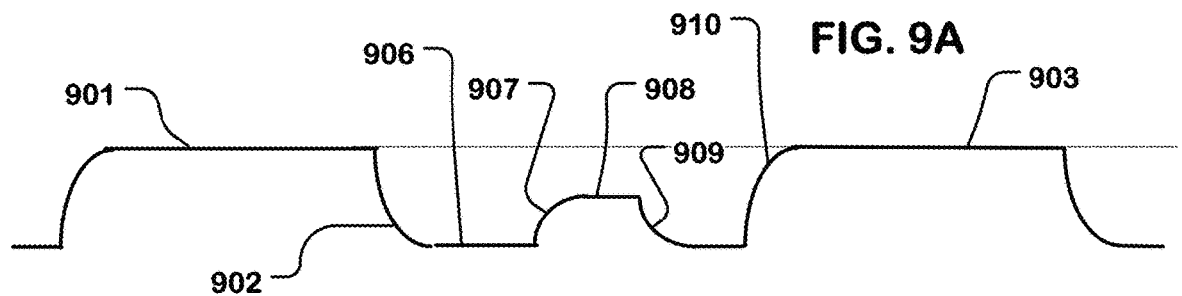
FIGS. 9A-9B illustrate a third example of a bias arrangement as described herein, and simulation of the channel potential as a result of the bias arrangement.

FIG. 9A illustrates a third example of a bias arrangement. In this example, the bias voltage comprises a pulse having a step-up at leading edge the verify bias arrangement, at the trailing edge 902 of the verify pass voltage pulse 901, the voltage on the word line can step-down to a lower level 906, such as ground. The pre-turn-on pulse includes a step-up 907 to an intermediate level 908, which can be greater than or equal to the maximum threshold voltage for a programmed cell, and a step-down 909 to the lower level, such as ground, before a step-up at leading edge 910 of the program pass voltage pulse. The pre-turn-on pulse 908 can correspond in time with the precharge pulses on the selected strings.

Figure 9B:
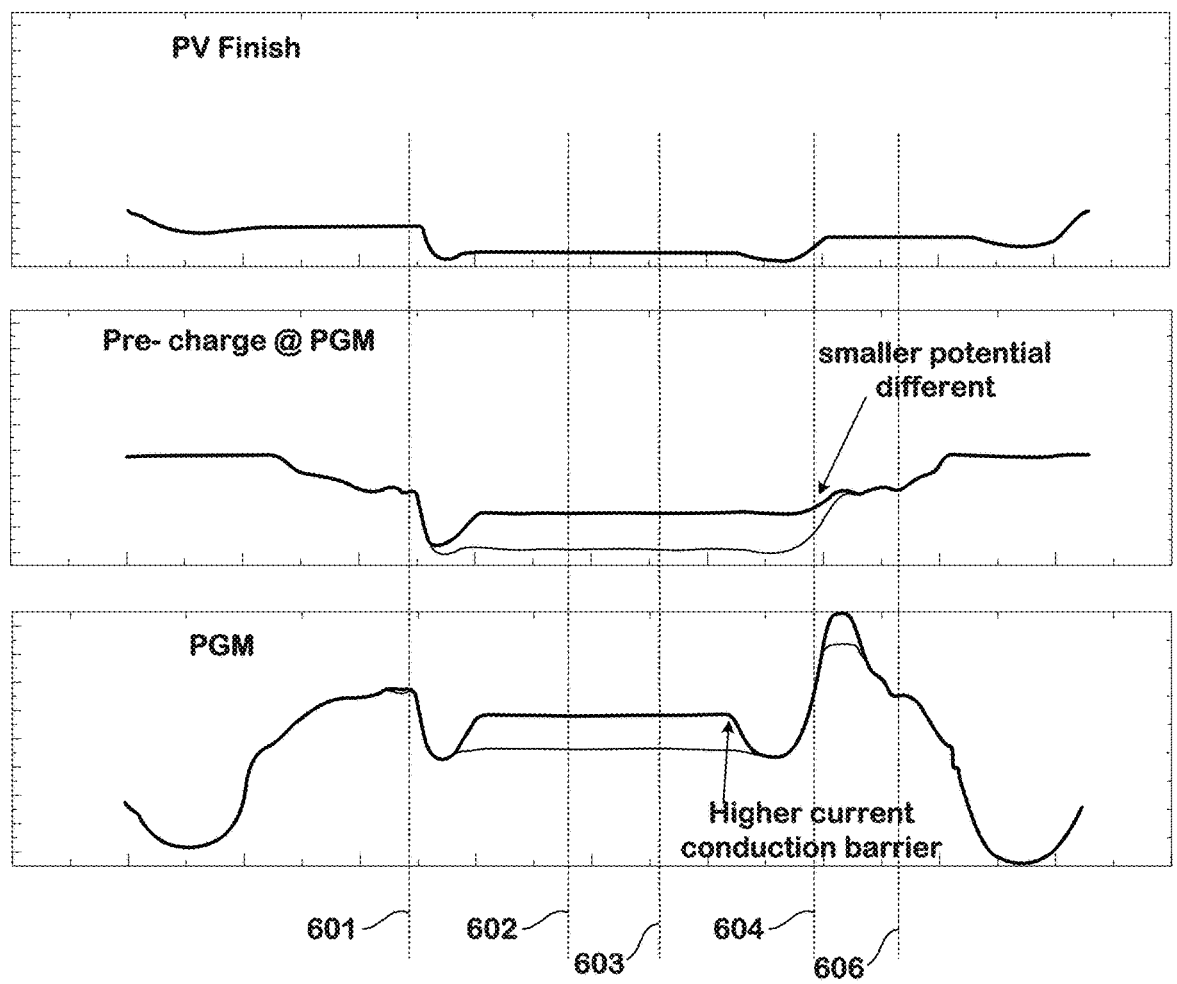

As shown in FIG. 9B, this third example bias arrangement can result in an increase in the potential under the high threshold memory cells adjacent the selected word line. This can result in a smaller potential difference between the high threshold cell and the selected cell during the program precharge pulse, and can increase the current conduction barrier blocking hot electrons during the program pulse.

Figure 10A:
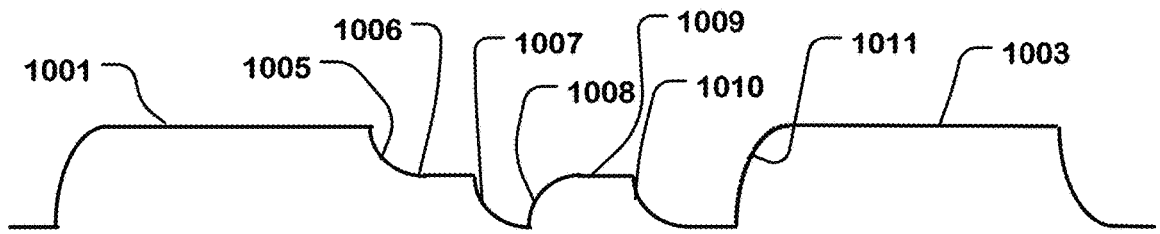
FIGS. 10A-10B illustrate a fourth example of a bias arrangement as described herein, and simulation of the channel potential as a result of the bias arrangement.

FIG. 10A illustrates a fourth example of a bias arrangement. In this example, the bias voltage comprises, in the interval between the pass voltage pulse 1001, during the program verify procedure, and the program pass voltage pulse 1003 during the program procedure, a step-down 1005 on the trailing edge of the verify pass voltage pulse to an intermediate first bias voltage level 1006, and holds the first bias voltage level for a part of the interval. Then, a step-down 1007 in the voltage moves the voltage down to a lower voltage level before the step-up at leading edge of the program pass voltage pulse 1003. Also, a pulse having a step-up 008 and a trailing edge 1010 is applied after the step-down 1007 and before the step-up at leading edge 1011 of the program pass voltage pulse 1003. This pulse increases the voltage to a second intermediate level 1009, which can be greater than the maximum threshold voltage for a high threshold cell in the memory. The second intermediate level 1009 can be the same as, or different than, the first intermediate bias voltage level 1006.

Figure 10B:
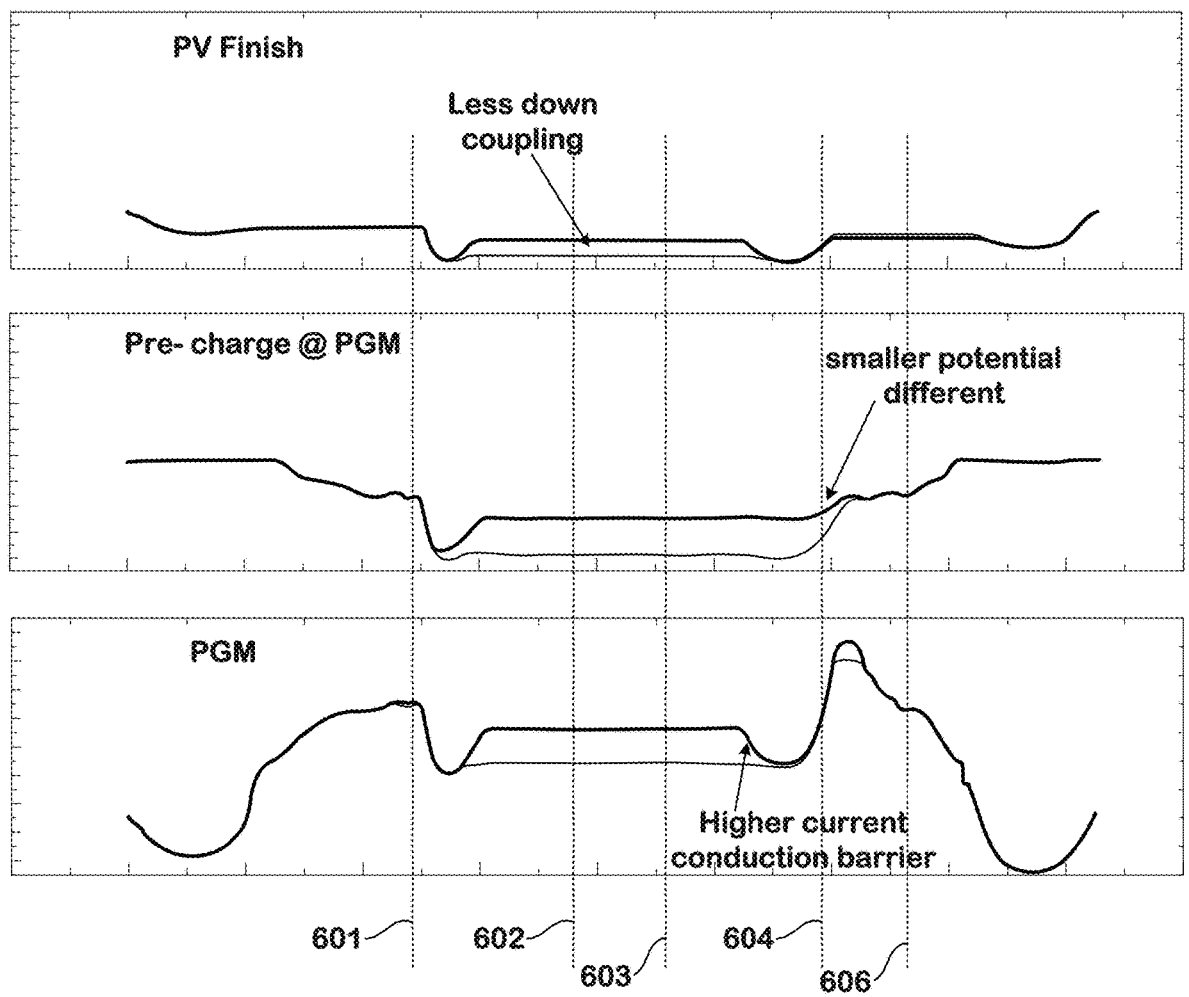

The simulation shown in FIG. 10B illustrates that this fourth example can result in less down-coupling during the program verify finish interval, a smaller potential difference during the precharge interval between the high threshold cell and the selected cell, and a higher conduction barrier during the program pulse.

Figure 11A:
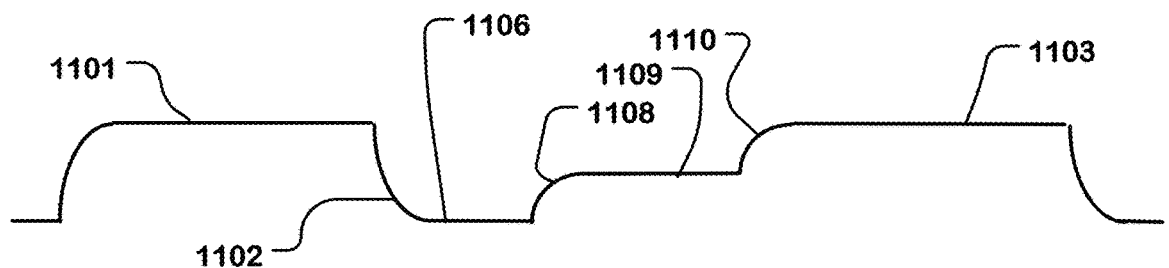
FIGS. 11A-11B illustrate a fifth example of a bias arrangement as described herein, and simulation of the channel potential as a result of the bias arrangement.

FIG. 11A illustrates a fifth example of a bias arrangement. In this example, the bias arrangement includes a step-down at the trailing edge 1102 of the verify pass voltage pulse 1101 to lower voltage level 1106, such as ground. Thereafter, a step-up 1108 occurs during the interval after the trailing edge 1102 of the verify pass voltage pulse 1101, to an intermediate bias voltage level 1109, which can be higher than the maximum threshold voltage VtMAX of the high threshold cell in the array. In this example, the intermediate bias voltage level 1109 is held until the step-up at leading edge 1110 of the program pass voltage pulse 1103.

Figure 11B:
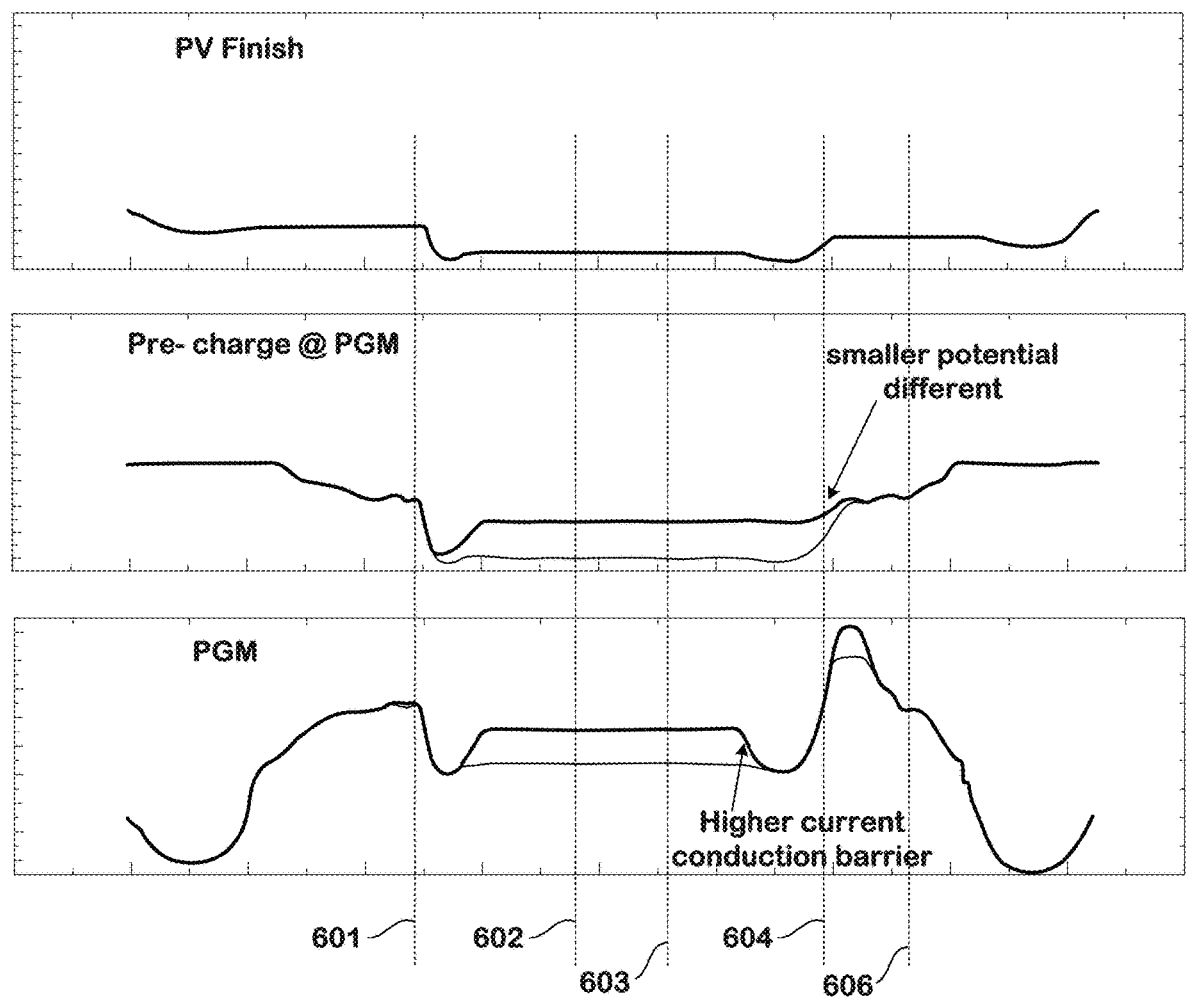

As the simulation shows in FIG. 11B, during the program verify finish interval, the potential distribution across the channel is about the same as that of a sequence without a pre-turn-on bias. During the precharge interval, because the voltage level 1109 improves the charge sharing with the low threshold cells above the selected cell, a smaller potential difference occurs between the high threshold cell in the selected cell. Also, during the program interval, a higher conduction barrier is induced that can block hot electrons from entering the region of the selected cell.

Figure 12A:
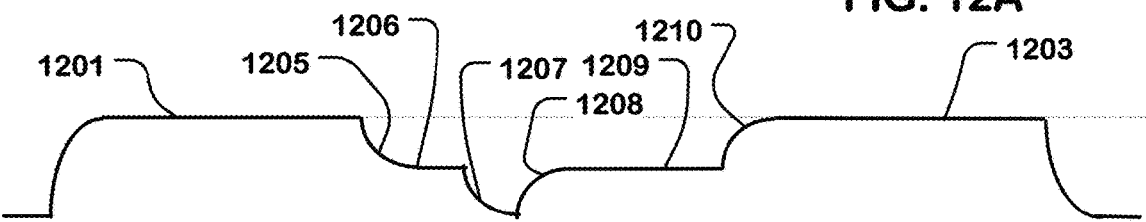
FIGS. 12A-12B illustrate a sixth example of a bias arrangement as described herein, and simulation of the channel potential as a result of the bias arrangement.

FIG. 12A illustrates a sixth example of a bias arrangement. In this example, the bias arrangements of FIG. 8A and of FIG. 11A are combined. Thus, the bias voltage applied in the interval between the trailing edge 1205 of verify pass voltage pulse 1201 and the leading edge 1201 of the program pass voltage pulse 1203 includes a step-down at trailing edge 1205 to an intermediate first bias level 1206, which can be higher than the maximum threshold voltage VtMAX of the high threshold cell. The intermediate first bias level is held during part of the interval to a step-down 1207 reducing the voltage to a lower voltage near ground, for example. After the step-down 1207, a step-up 1208 occurs to an intermediate second bias level 1209 (which can be higher than VtMAX), which is held until the step-up at leading edge 1210 of the program pass voltage pulse 1203.

Figure 12B:
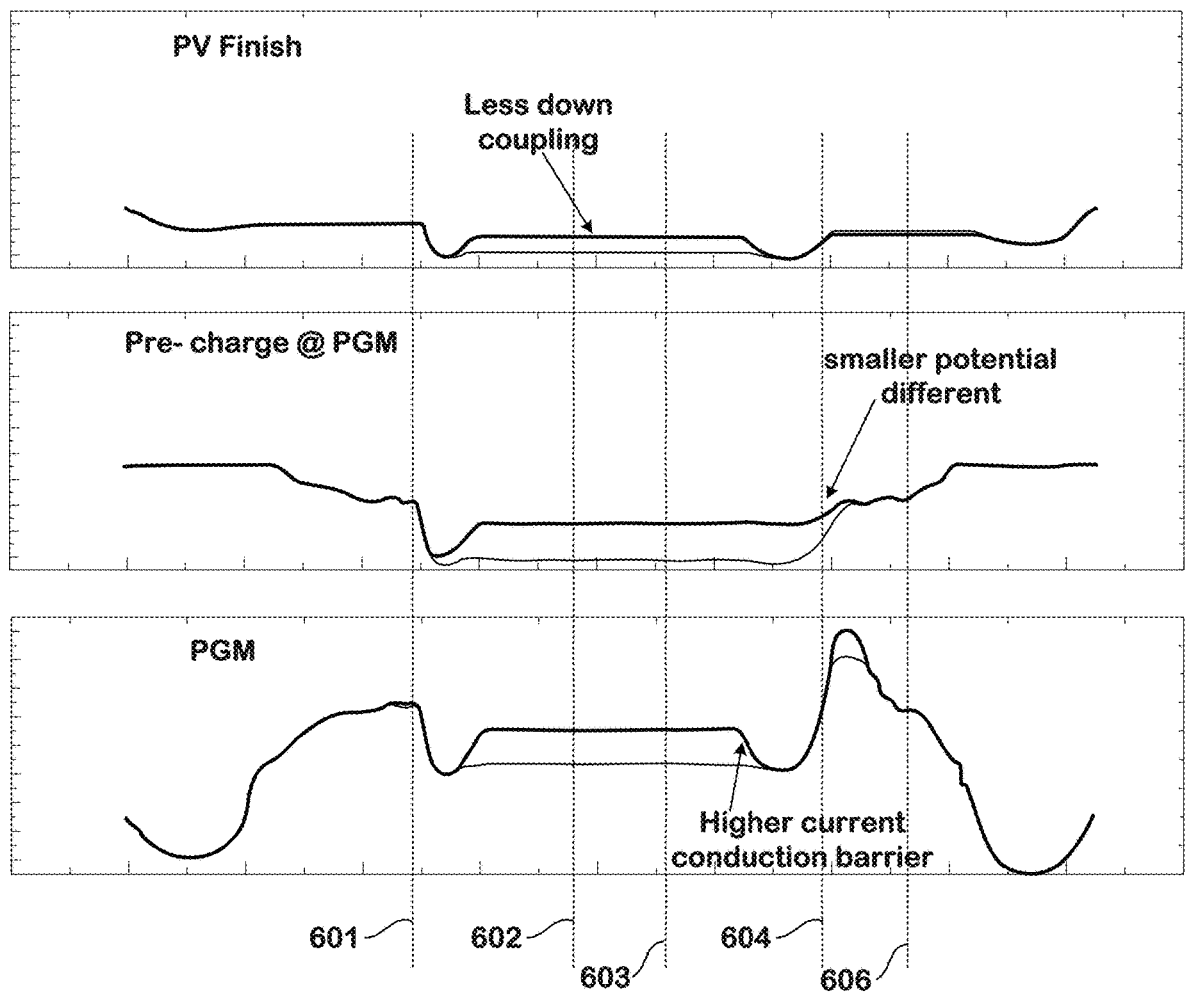

As the simulations show in FIG. 12B, this sixth example arrangement results in less down-coupling during the program verify finish interval, the smaller potential difference between high threshold cell and the selected cell during the program precharge interval, and a high conduction barrier during the program interval.

The intermediate voltages applied during the bias arrangement tend to turn on the channel beneath the high threshold cells. These intermediate voltages are preferred to be higher than the maximum threshold voltage VtMAX of the memory cells storing data. However, if they are too high, they can result in charge disturbance in unselected word lines. Therefore, in embodiments of the pre-turn-on and soft ramp-down bias arrangements described herein, the intermediate voltages can be set in a range from VtMAX to about VtMAX+1V. In any event, the intermediate voltages held during parts of the bias arrangement are less than the maximum level of the program pass voltage pulse. In some embodiments, the intermediate voltages held during parts of the bias arrangement are greater than VtMAX and less than the maximum level of the program pass voltage pulse.

In general, the bias arrangements as described herein are applied in a time interval between a verify pass voltage pulse and a program pass voltage pulse to mitigate lateral electric fields when the program pass voltage pulses are applied.

In a memory device as described with reference to FIG. 1, the controller is operatively coupled to the word line driver circuits and the bit line driver circuits, and includes logic to execute a program sequence for the program memory cells on a selected word line in an array of NAND strings that also includes a plurality of unselected word lines. The program sequence includes a program verify procedure followed by a program procedure. In embodiments of a device as described herein, the controller is configured to execute bias arrangements as described herein. The bias arrangements can include combinations of soft step-down features, which reduce the effect of capacitive coupling during the interval that result in changes in the pass voltages, and pre-turn-on voltages which tend to turn on the channel beneath the high threshold cells adjacent the selected cell.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for programming a NAND memory, comprising:
   executing a program sequence to program a memory cell on a selected word line in a NAND string including a plurality of unselected word lines, the program sequence including a program verify procedure followed by a program procedure;
   in the program verify procedure, applying a verify read voltage pulse to the selected word line, and verify pass voltage pulses to unselected word lines;
   in the program procedure, pre-charging the NAND string, and then applying a program voltage pulse to the selected word line and program pass voltage pulses to unselected word lines; and
   applying an intermediate bias voltage to at least one unselected word line in a time interval between the verify pass voltage pulse and the program pass voltage pulse, the intermediate bias voltage having a maximum voltage level greater than or equal to a maximum threshold voltage for a programmed cell tending to turn on a channel of a memory cell at the at least one unselected word line.

2. The method of claim 1, the intermediate bias voltage having a maximum voltage level less than a maximum level of the program pass voltage pulse.

3. The method of claim 1, the intermediate bias voltage having a maximum voltage level in a range from a maximum threshold voltage VtMAX for a programmed cell and the VtMAX+1 Volt.

4. The method of claim 1, the intermediate bias voltage comprising a step-down from a trailing edge of the verify pass voltage pulse to the intermediate bias voltage level, and holding the bias voltage level until a step-up at leading edge of the program pass voltage pulse.

5. The method of claim 1, the intermediate bias voltage comprising a step-down from a trailing edge of the verify pass voltage pulse to the intermediate bias voltage level, and holding the intermediate bias voltage level for part of the interval, and then a step-down to a lower voltage level before a leading edge of the program pass voltage pulse.

6. The method of claim 1, the intermediate bias voltage comprising a pulse having a step-up at a leading edge during the interval after a trailing edge of the verify pass voltage pulse to the intermediate bias voltage level, and having a trailing edge before a leading edge of the program pass voltage pulse.

7. The method of claim 1, the intermediate bias voltage comprising a step-down on a trailing edge of the verify pass voltage pulse to the intermediate bias voltage level, and holding the intermediate bias voltage level for part of the interval, and then a step-down to a lower voltage level before a leading edge of the program pass voltage pulse, and a pre-turn-on pulse during the interval after the step-down, having a step-up to a second intermediate bias voltage level, and having a step-down before a leading edge of the program pass voltage pulse.

8. The method of claim 1, the intermediate bias voltage comprising a step-up during the interval after a trailing edge of the verify pass voltage pulse to the intermediate bias voltage level, and holding the bias voltage level to a leading edge of the program pass voltage pulse.

9. The method of claim 1, the intermediate bias voltage comprising a step-down from a trailing edge of the verify pass voltage pulse to the intermediate bias voltage level, and holding the intermediate bias voltage level for part of the interval, and then a step-down to a lower voltage level before a leading edge of the program pass voltage pulse, and a step-up during the interval after the step-down, to a second bias voltage level, and holding the second intermediate bias voltage level to a leading edge of the program pass voltage pulse.

10. A NAND memory; comprising:
an array of NAND strings, including plurality of word lines and a plurality of bit lines;
word line driver circuits and bit line driver circuits;
a controller operatively coupled to the word line driver circuits and bit line driver circuits, the controller including logic to execute a program sequence to program memory cells on a selected word line in the array of NAND strings including a plurality of unselected word lines, the program sequence including a program verify procedure followed by a program procedure;
the program verify procedure including causing the word line driver circuits to apply a verify read voltage pulse to the selected word line, and verify pass voltage pulses to unselected word lines, and determining whether selected NAND strings in a block pass verify;
the program procedure including precharging the NAND strings, and then causing the word line driver circuits to apply a program voltage pulse to the selected word line and program pass voltage pulses to unselected word lines, and causing the bit line driver circuits to apply program inhibit voltages to unselected NAND strings; and
the controller including logic to cause the word line driver circuits to apply an intermediate bias voltage to at least one unselected word line in a time interval between the verify pass voltage pulse and the program pass voltage pulse, the intermediate bias voltage having an intermediate bias voltage level greater than or equal to a maximum threshold voltage for a programmed cell tending to turn on a cell or cells on the at least one unselected word line during the time interval.

11. The memory of claim 10, the intermediate bias voltage having a maximum voltage level in a range from a maximum threshold voltage VtMAX for a programmed cell and the VtMAX+1 Volt.

12. The memory of claim 10, the intermediate bias voltage comprising a step-down from a trailing edge of the verify pass voltage pulse to the intermediate bias voltage level, and holding the intermediate bias voltage level until a leading edge of the program pass voltage pulse.

13. The memory of claim 10, the intermediate bias voltage comprising a step-down from a trailing edge of the verify pass voltage pulse to an intermediate bias voltage level, and holding the intermediate bias voltage level for part of the interval, and then a step-down to a lower voltage level before a leading edge of the program pass voltage pulse.

14. The memory of claim 10, the intermediate bias voltage comprising a pulse having a step-up during the interval after a trailing edge of the verify pass voltage pulse to an intermediate bias voltage level greater than or equal to a maximum threshold voltage for a programmed cell, and having a step-down before a leading edge of the program pass voltage pulse.

15. The memory of claim 10, the intermediate bias voltage comprising a step-down from a trailing edge of the verify pass voltage pulse to the intermediate bias voltage level, and holding the intermediate bias voltage level for part of the interval, and then a step-down to a lower voltage level before a leading edge of the program pass voltage pulse, and a pulse having a step-up during the interval after the step-down, to a second intermediate bias voltage level, and having a step down before a leading edge of the program pass voltage pulse.

16. The memory of claim 10, the intermediate bias voltage comprising a step-up during the interval after a trailing edge of the verify pass voltage pulse to the intermediate bias voltage level, and holding the intermediate bias voltage level to a leading edge of the program pass voltage pulse.

17. The memory of claim 10, the intermediate bias voltage comprising a step-down from a trailing edge of the verify pass voltage pulse to the intermediate bias voltage level, and holding the intermediate bias voltage level for part of the interval, and then a step-down to a lower voltage level before a leading edge of the program pass voltage pulse, and a step-up during the interval after the step-down, to a second intermediate bias voltage level, and holding the second intermediate bias voltage level to a leading edge of the program pass voltage pulse.

* * * * *